United States Patent
Zhang et al.

(10) Patent No.: US 9,177,858 B1
(45) Date of Patent: Nov. 3, 2015

(54) METHODS FOR FABRICATING INTEGRATED CIRCUITS INCLUDING BARRIER LAYERS FOR INTERCONNECT STRUCTURES

(71) Applicant: GLOBALFOUNDRIES, Inc., Grand Cayman (KY)

(72) Inventors: Xunyuan Zhang, Albany, NY (US); Tibor Bolom, Litomerice (CZ); Kun Ho Ahn, Dresden (DE); Bernd Hintze, Langebrueck (DE); Frank Koschinsky, Radebeul (DE)

(73) Assignee: GLOBALFOUNDRIES, INC., Grand Cayman (KY)

( * ) Notice: Subject to any disclaimer, the term of this patent is extended or adjusted under 35 U.S.C. 154(b) by 0 days.

(21) Appl. No.: 14/272,787

(22) Filed: May 8, 2014

(51) Int. Cl.
*H01L 21/4763* (2006.01)
*H01L 21/768* (2006.01)
*H01L 21/285* (2006.01)

(52) U.S. Cl.
CPC ........ *H01L 21/7685* (2013.01); *H01L 21/2855* (2013.01); *H01L 21/28556* (2013.01); *H01L 21/28568* (2013.01); *H01L 21/76802* (2013.01); *H01L 21/76834* (2013.01); *H01L 21/76843* (2013.01); *H01L 21/76871* (2013.01); *H01L 21/76879* (2013.01)

(58) Field of Classification Search
CPC .............. H01L 21/76841; H01L 21/76846; H01L 21/76867; H01L 21/2855; H01L 21/28556; H01L 21/7685

USPC .................. 438/622, 627, 639, 653
See application file for complete search history.

(56) References Cited

U.S. PATENT DOCUMENTS

| | | | |
|---|---|---|---|
| 6,613,660 B2 | 9/2003 | Kahlert et al. | |
| 7,820,536 B2 | 10/2010 | Schuehrer et al. | |
| 8,318,266 B2 | 11/2012 | Chen et al. | |
| 2005/0074968 A1* | 4/2005 | Chen et al. | 438/643 |
| 2012/0000422 A1 | 1/2012 | Lam et al. | |
| 2012/0269987 A1* | 10/2012 | Dordi et al. | 427/539 |
| 2014/0252630 A1* | 9/2014 | Chang et al. | 257/763 |

OTHER PUBLICATIONS

Song et al. "Phase Formation in the Tantalum Carbonitride Film Deposited With Atomic Layer Deposition Using Ammonia", Journal of The Electrochemical Society, 2008, pp. H823-H828, 155.

* cited by examiner

*Primary Examiner* — Tu-Tu Ho
(74) *Attorney, Agent, or Firm* — Ingrassia Fisher & Lorenz, P.C.

(57) ABSTRACT

Methods for fabricating integrated circuits are provided. In one example, a method for fabricating an integrated circuit includes forming a barrier layer overlying a metal line of a metallization layer above a semiconductor substrate using an atomic layer deposition (ALD) process and a physical vapor deposition (PVD) process. A liner-forming material is deposited overlying the barrier layer to form a liner. A conductive metal is deposited overlying the liner.

20 Claims, 6 Drawing Sheets

US 9,177,858 B1

METHODS FOR FABRICATING INTEGRATED CIRCUITS INCLUDING BARRIER LAYERS FOR INTERCONNECT STRUCTURES

TECHNICAL FIELD

The technical field relates generally to methods for fabricating integrated circuits, and more particularly relates to methods for fabricating integrated circuits including forming a robust barrier layer such as for a back-end-of-the-line interconnect structure.

BACKGROUND

Integrated circuits (ICs) typically include a plurality of semiconductor devices and interconnect wiring. Networks of metal interconnect wiring are often used to connect the semiconductor devices from the semiconductor portion of the substrate. Multiple levels of metal interconnect wiring form a plurality of metallization layers above the semiconductor portion of the substrate and are connected together to form a back-end-of-the-line ("BEOL") interconnect structure. Within such a structure, metal lines run parallel to the substrate in the metallization layers and conductive vias run perpendicular to the substrate between the metallization layers to interconnect the metal lines.

High performance of contemporary ICs may be achieved using a highly conductive metal, such as copper (Cu), as the interconnect metal of the BEOL interconnect structure, which also employs a low dielectric constant material or dielectric material as an interlevel dielectric (ILD) layer or layers to insulate the interconnect wires from each other. To help prevent migration of the interconnect metal into the ILD layer, a barrier-forming material, such as tantalum nitride (TaN), is deposited onto the dielectric material to form a barrier layer. A metal liner material, such as tantalum (Ta) or the like, is deposited overlying the barrier layer to form a metal liner layer to help hold the highly conductive interconnect metal to the barrier layer and the underlying dielectric material. Then, a conductive metal seed layer, such as a layer of copper (Cu) or copper alloy, is formed on the metal liner layer and the highly conductive metal (e.g., Cu) is deposited over the conductive metal seed layer to form a metal interconnect wire. Unfortunately, many conventional approaches for forming the barrier layers for such interconnect structures can (1) damage the underlying dielectric material of the ILD layer, (2) produce non-conformal barrier layers that are too thin or discontinuous particularly along vertical walls or too thick particularly around corners of the ILD layer, and/or (3) form relatively low density barrier layers that have undesirably high resistivity and/or are susceptible to damage by impurities, such as oxygen (O), carbon (C), or the like, that are produced during subsequent deposition of the liner.

Accordingly, it is desirable to provide methods for fabricating integrated circuits including forming barrier layers that are more robust such as for back-end-of-the-line interconnect structures. Furthermore, other desirable features and characteristics of the present invention will become apparent from the subsequent detailed description and the appended claims, taken in conjunction with the accompanying drawings and this background.

BRIEF SUMMARY

Methods for fabricating integrated circuits are provided herein. In accordance with an exemplary embodiment, a method for fabricating an integrated circuit includes forming a barrier layer overlying a metal line of a metallization layer above a semiconductor substrate using an atomic layer deposition (ALD) process and a physical vapor deposition (PVD) process. A liner-forming material is deposited overlying the barrier layer to form a liner. A conductive metal is deposited overlying the liner.

In accordance with another exemplary embodiment, a method for fabricating an integrated circuit is provided. The method includes etching a via-hole through an ILD layer of dielectric material to expose a metal line of a metallization layer above a semiconductor substrate. A first tantalum nitride (TaN) layer is deposited into the via-hole overlying the metal line using an atomic layer deposition (ALD) process. A second TaN layer is deposited into the via-hole overlying the first TaN layer using a physical vapor deposition (PVD) process to form a barrier layer. The barrier layer includes the first and second TaN layers. A liner is formed in the via-hole overlying the barrier layer. A conductive metal seed layer is deposited into the via-hole overlying the liner. A remaining portion of the via-hole is filled with a conductive metal fill overlying the conductive metal seed layer.

In accordance with another exemplary embodiment, a method for fabricating an integrated circuit is provided. The method includes forming a barrier layer overlying a metal line of a metallization layer above a semiconductor substrate. Forming the barrier layer includes depositing a first tantalum nitride (TaN) layer overlying the metal line using an atomic layer deposition (ALD) process. An upper portion of the first TaN layer is a densified by depositing a second TaN layer overlying the first TaN layer using a physical vapor deposition (PVD) process. A liner is formed overlying the barrier layer. A conductive metal is deposited overlying the liner.

BRIEF DESCRIPTION OF THE DRAWINGS

The various embodiments will hereinafter be described in conjunction with the following drawing figures, wherein like numerals denote like elements, and wherein.

DETAILED DESCRIPTION

Figure 1:
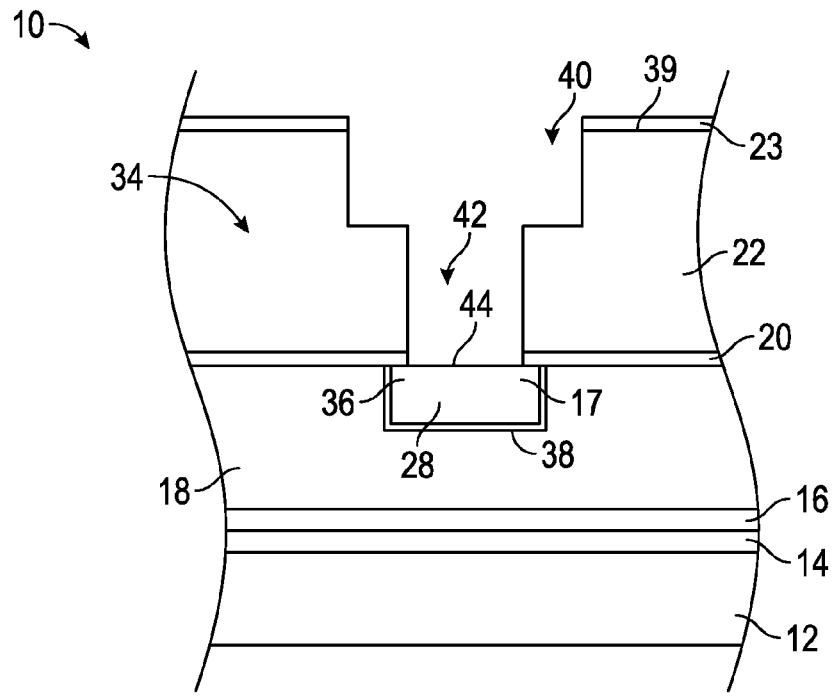
FIGS. 1, 2, 3A, 3B, 3C, and 4 through 10 illustrate, in cross-sectional views, an integrated circuit and a method for fabricating an integrated circuit during various intermediate fabrication stages in accordance with an exemplary embodiment.

The following Detailed Description is merely exemplary in nature and is not intended to limit the various embodiments or the application and uses thereof. Furthermore, there is no intention to be bound by any theory presented in the preceding background or the following detailed description.

Various embodiments contemplated herein relate to methods for fabricating integrated circuits including forming a back-end-of-the-line (BEOL) interconnect structure. Formation of the BEOL interconnect structure includes etching a via-hole through an ILD layer of dielectric material (e.g., a relatively porous dielectric material) to expose sidewalls of the ILD layer and a metal line of a metallization layer above a semiconductor substrate. A barrier layer is formed in the via-hole overlying the sidewalls of the ILD layer and the metal line using an atomic layer deposition (ALD) process and a physical vapor deposition (PVD) process. In an exemplary embodiment, the barrier layer is formed by depositing a barrier-forming material such as tantalum nitride (TaN) into the via-hole using the ALD process to form a first layer that overlies the sidewalls of the ILD layer and the metal line. In an exemplary embodiment, it has been found that by depositing the barrier-forming material using the ALD process, the first layer is conformal having a relatively uniform thickness along the metal line and the sidewalls of the ILD layer. Additional barrier-forming material (e.g., TaN) is then deposited into the via-hole using the PVD process to form a second layer that overlies the first layer. In an exemplary embodiment, it has been found that by depositing the additional barrier-forming material using the PVD process, at least an upper portion of the first layer is densified by ion bombardment of the additional barrier-forming material onto the upper surface of the first layer to form the barrier layer with a relatively dense (densified) upper portion that includes the second layer and the upper portion of the first layer. As such, the barrier layer is more robust than typical barrier layers that are formed by conventional processes in that the first layer is conformal providing a continuous barrier along the sidewalls of the of the ILD layer to help protect the underlying dielectric material and the densified upper portion of the barrier layer has a relatively high density with desirably lower resistivity and/or is less susceptible to damage by impurities during subsequent processing. A liner is then formed in the via-hole overlying the barrier layer. A conductive metal seed layer is deposited into the via-hole overlying the liner and a remaining portion of the via-hole is filled with a conductive metal fill overlying the conductive metal seed layer to form an interconnect structure.

FIGS. 1-10 illustrate, in cross-sectional view, an integrated circuit (IC) 10 during various fabrication stages. The described process steps, procedures, and materials are to be considered only as exemplary embodiments designed to illustrate to one of ordinary skill in the art methods for practicing the invention; the invention is not limited to these exemplary embodiments. Various steps in the manufacture of ICs are well known and so, in the interest of brevity, many conventional steps will only be mentioned briefly herein or will be omitted entirely without providing the well-known process details.

FIG. 1 illustrates a portion of the IC 10 during an intermediate fabrication stage in accordance with an exemplary embodiment. The IC 10 includes a semiconductor substrate 12. As used herein, the term 'semiconductor substrate' will be used to encompass semiconductor materials conventionally used in the semiconductor industry from which to make electrical devices. Semiconductor materials include monocrystalline silicon materials, such as the relatively pure or lightly impurity-doped monocrystalline silicon materials typically used in the semiconductor industry, as well as polycrystalline silicon materials, and silicon admixed with other elements such as germanium, carbon, and the like. In addition, 'semiconductor material' encompasses other materials such as relatively pure and impurity-doped germanium, gallium arsenide, zinc oxide, glass, and the like. The semiconductor material is preferably a silicon substrate. The silicon substrate may be a bulk silicon wafer or may be a thin layer of silicon on an insulating layer (commonly known as silicon-on-insulator or SOI) that, in turn, is supported by a carrier wafer.

Additionally, the IC 10 includes a semiconductor device layer 14 that may be made up of active areas (not shown) in which a plurality of active and/or passive circuit elements (not shown), such as transistors, capacitors, resistors, and the like may be formed. It should be appreciated that the semiconductor device layer 14, even if including a substantially silicon-based material layer, may include other semiconducting materials, such as germanium, carbon, and the like, in addition to appropriate dopant species for establishing the requisite active area conductivity type for the circuit elements.

As illustrated, the IC 10 also includes a contact layer 16 that may be formed above the semiconductor device layer 14. In an exemplary embodiment, the contact layer is an inter-level dielectric (ILD) layer of dielectric material (e.g., porous dielectric material of silicon dioxide, silicon nitride, silicon oxynitride or the like) with a plurality of contact vias (not shown) formed therethrough as is well known in the art. Typically, the contact vias provide conductive electrical connections between one or more of the various circuit elements (not shown) disposed along the semiconductor device layer 14 to vias within an ILD layer 18 (discussed below).

As illustrated in FIG. 1, above the semiconductor substrate 12 and the contact layer 16, the IC 10 includes a metallization layer 17 that is disposed in the ILD layer 18 of dielectric material (e.g., porous dielectric material of silicon dioxide, silicon nitride, silicon oxynitride or the like). The vias within contact layer 16 are in electrical connection with the vias within ILD layer 18 and, accordingly, establish electrical connection between the electrical devices of semiconductor device layer 14 and metallization layer 17. It is to be appreciated that the IC 10 may include two metallization layers or more than two metallization layers, depending on the overall device requirements.

Overlying the ILD layer 18 and the metallization layer 17 is an N-doped silicon carbide (SiCN) layer 20, an overlying ILD layer 22 of dielectric material (e.g., porous dielectric material of silicon dioxide, silicon nitride, silicon oxynitride or the like), and an overlying hard mask layer 23 (e.g., silicon dioxide or the like). In an exemplary embodiment, the ILD layers 18 and 22 are each relatively thick independently with a thickness of from about 200 to about 1500 nm, and the N-doped SiCN layer 20 has a thickness of from about 10 to about 50 mm. The metallization layer 17 includes a metal line 28. While only one metal line is shown in FIG. 1 for illustrative purposes, it is to be appreciated that the metallization layer 17 can include a plurality of discrete and spaced apart metal lines similarly configured to the metal line 28 that form part of a BEOL interconnect structure 34 disposed above the contact layer 16. The metal line 28 is formed of a conductive metal fill 36 and a barrier/liner 38. The conductive metal fill 36 is a highly conductive material such as copper and the barrier/liner 38 is one or more layers of a barrier- and/or liner-forming material(s) such as tantalum (Ta), tantalum nitride (TaN), titanium (Ti), and/or titanium nitride (TiN) to help inhibit or prevent diffusion of the conductive metal fill 36 into the ILD layer 18 and/or to help hold the conductive metal fill 36 to the ILD layer 18.

As illustrated, a metal line trench 40 is formed into an upper portion of the ILD layer 22. Aligned with and opened to the metal line trench 40, is a via-hole 42 that extends through the ILD layer 22 to expose an upper surface 44 of the metal line 28.

The illustrated portion of the BEOL interconnect structure 34 may be formed on the basis of well-known techniques. In an exemplary embodiment, the ILD layer 18 is formed by depositing a dielectric material such as silicon dioxide or the like that includes some impurities (e.g., carbon or the like) overlying the contact layer 16 using a chemical vapor deposition (CVD) process and treating the dielectric material for example with UV radiation to out gas the impurities and form porosity in the ILD layer 18 to further lower the dielectric constant of the dielectric material. The top surface of the ILD layer 18 is planarized using a chemical mechanical planarization (CMP) process. Next, the ILD layer 18 is patterned and etched using, for example, a dry etching process to form a metal line trench. The trench is then filled by depositing a barrier/liner-forming material(s) and the conductive metal fill 36 into the metal line trench using a physical vapor deposition (PVD) process (or an atomic layer deposition (ALD) process) and an electrochemical plating (ECP) process, respectively, to form the metal line 28. Any overburden of conductive metal fill 36 and/or barrier/liner-forming material(s) is removed by CMP. Next, the N-doped SiCN layer 20 is deposited overlying the ILD layer 18 and the metal line 28 using a CVD process. The ILD layer 22 is then formed (e.g., via depositing and treating a dielectric material as discussed above in relation to the ILD layer 18) over the N-doped SiCN layer 20 followed by CMP to expose an upper-surface portion 39 of the ILD layer 22. The hard mask layer 23 is then deposited for example by the decomposition of a source material such as tetraethylorthosilicate (TEOS). The metal line trench 40 and the via-hole 42 are formed using well-known lithography and etching techniques (e.g., dry etching techniques such as plasma etching or the like) to pattern the hard mask layer 23 and selectively remove portions of the ILD layer 22.

Figure 2:
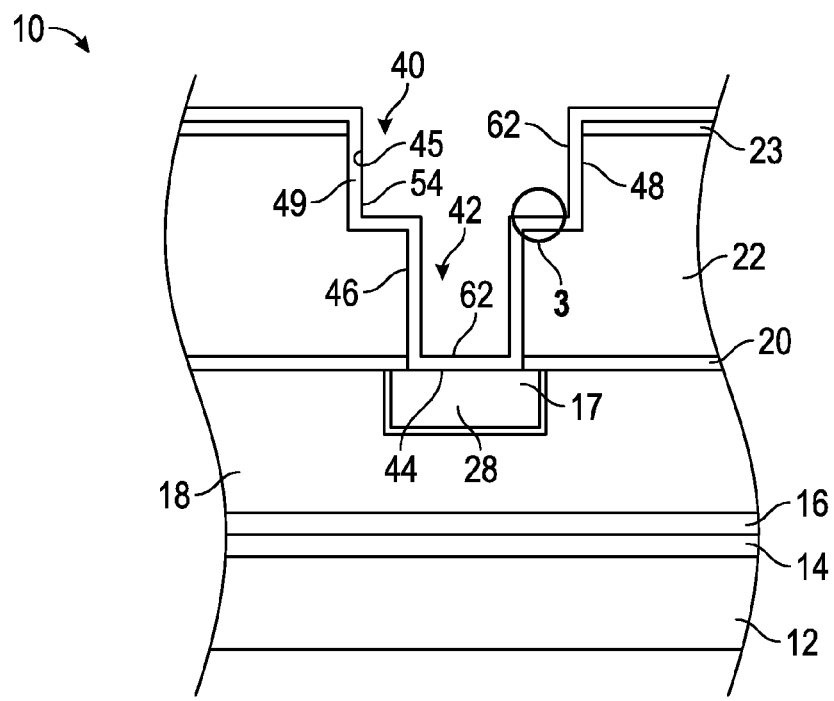

The process continues as illustrated in FIG. 2 by forming a barrier layer 45 overlying a top surface of the hard mask layer 23, the sidewalls 46 and 48 of the ILD layer 22 that define the via-hole 42 and the metal line trench 40, and the upper surface 44 of the metal line 28 using an ALD process and a PVD process. In an exemplary embodiment and with reference also to FIG. 3A, the barrier layer 45 is formed by initially depositing a barrier-forming material 49 overlying the top surface of the hard mask layer 23, the sidewalls 46 and 48 of the ILD layer 22, and the upper surface 44 of the metal line 28 to form a layer 50. In an exemplary embodiment, the barrier-forming material 49 includes TaN and is deposited using the ALD process to form the layer 50. In an exemplary embodiment, the layer 50 has a thickness (indicated by double headed arrow 52) of from about 3 to about 30 Å, for example, from about 5 to about 10 Å. In an exemplary embodiment, it has been found that by depositing the layer 50 using the ALD process the layer 50 is conformal, providing continuous coverage along the sidewalls 46 and 48 of the ILD layer 22 and over the metal line 28, and has a relatively low density. In an exemplary embodiment, the layer 50 has a density of from about 8 to about 12 g/cm$^3$, such as from about 9 to about 11 g/cm$^3$, for example about 10 g/cm$^3$.

Figure 3A:
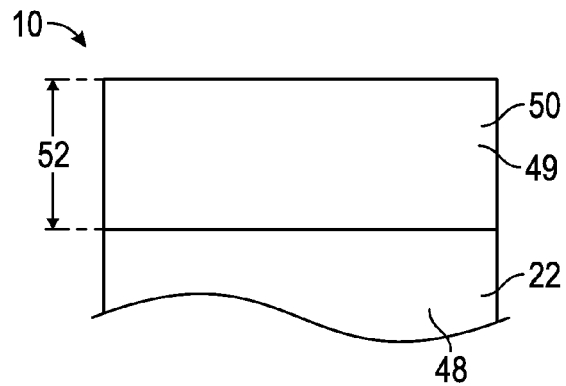
Figure 3B:
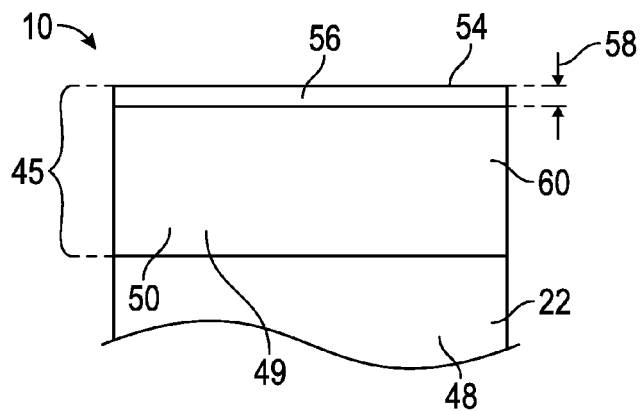
Figure 3C:
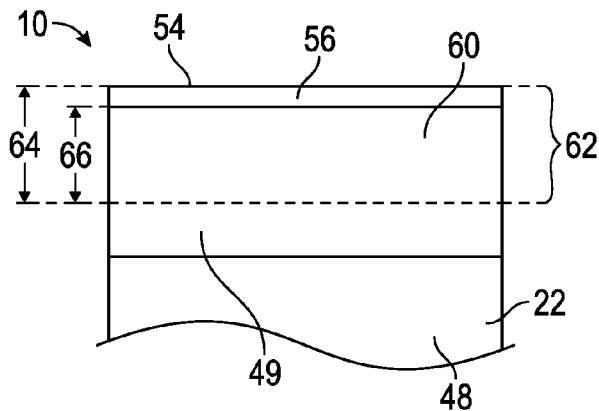

With reference to FIGS. 2 and 3B-3C, an additional barrier-forming material 54 is deposited overlying the layer 50 to form the layer 56. In an exemplary embodiment, the additional barrier-forming material 54 includes TaN and is deposited using the PVD process to form the layer 56. In an exemplary embodiment, the layer 56 has a thickness (indicated by single headed arrows 58) of from about 3 to about 30 Å, for example, from about 5 to about 20 Å. In an exemplary embodiment, it has been surprisingly found that by depositing the layer 56 using the PVD process the layer 56 has a relatively high density and further, at least an upper portion 60 of the layer 50 is densified by being ion bombarded by the additional barrier-forming material 54 to produce the barrier layer 45 with a densified upper portion 62 that includes the layer 56 and the upper portion 60 of the layer 50 (shown in FIG. 3C). In an exemplary embodiment, the densified upper portion 62 of the barrier layer 45 has a relatively low resistivity compared to conventional barrier layers and/or is less susceptible to damage by impurities such as carbon (C), oxygen (O), and the like that may be produced during subsequent processing. In an exemplary embodiment, the layer 56 and the upper portion 60 of the layer 50 have a density of from about 13 to about 15 g/cm$^3$. In an exemplary embodiment, the densified upper portion 62 of the barrier layer 45 has a thickness (indicated by double headed arrow 64) of from about 5 to about 103 Å and the upper portion 60 of the layer 50 that is densified has a thickness (indicated by double headed arrow 66) of from about 2 to about 100 Å.

Figure 4:
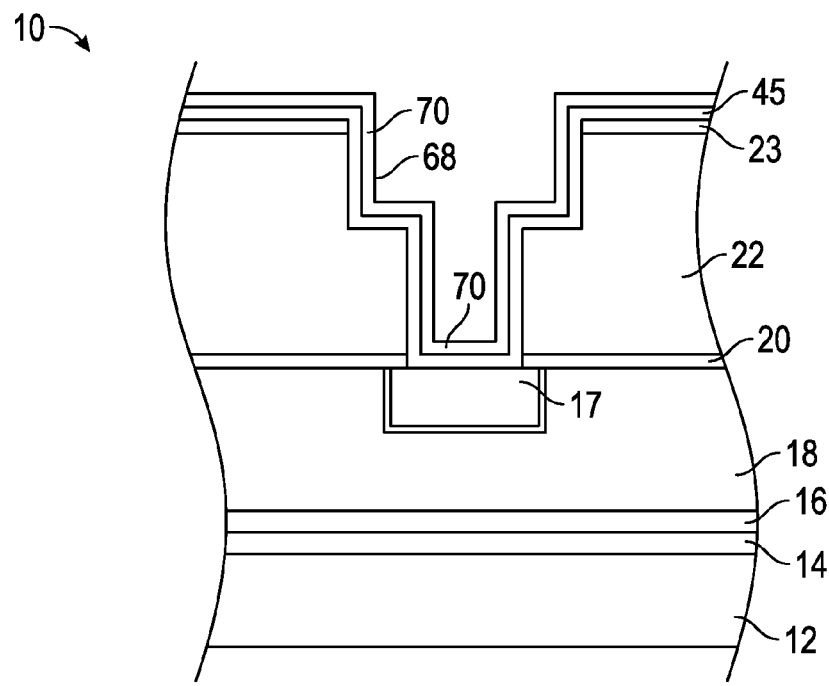

The process continues as illustrated in FIG. 4 by depositing a liner-forming material 68 overlying the barrier layer 45 to form a liner 70. In an exemplary embodiment, the liner-forming material 68 includes tantalum (Ta) and is deposited by a PVD process. In another embodiment, the liner-forming material 68 includes ruthenium (Ru), cobalt (Co), or a combination thereof and is deposited by a CVD process, an ALD process, or a PVD process. In an exemplary embodiment, the liner 70 has a thickness of from about 20 to about 400 Å.

Figure 5:
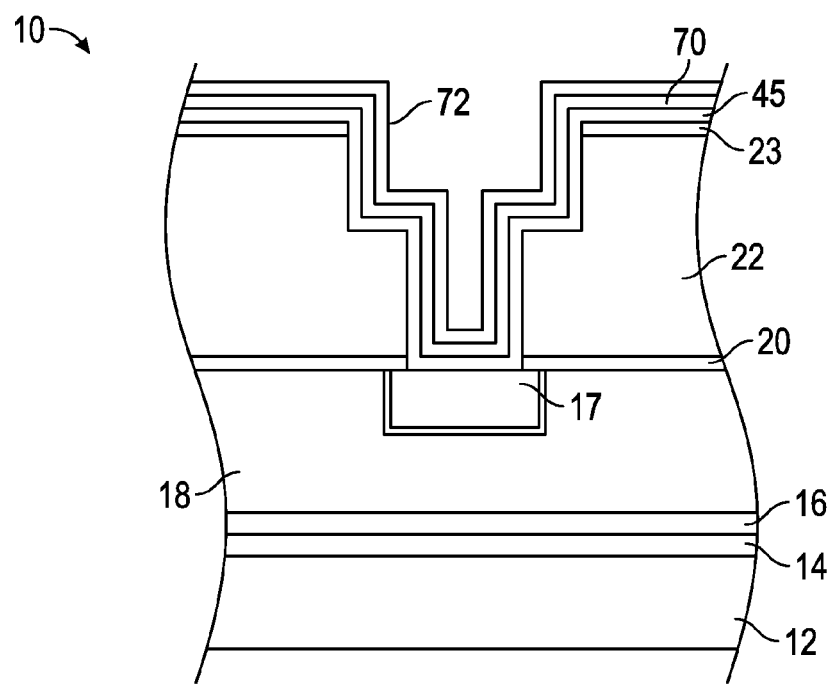
Figure 6:
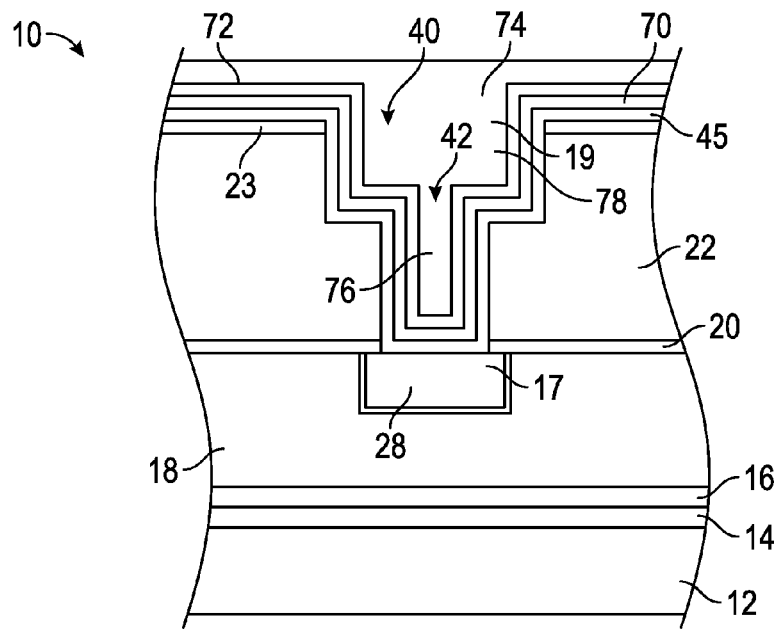
Figure 7:
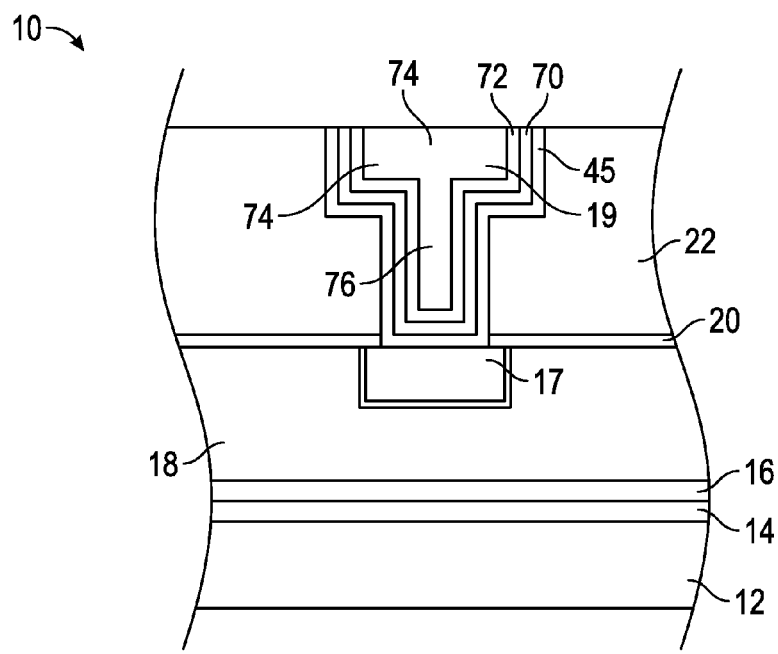

Referring to FIG. 5, a conductive metal seed layer 72 (e.g., Cu) is deposited overlying the liner 70. In an exemplary embodiment, the conductive metal seed layer 72 is deposited using a PVD process. As illustrated in FIG. 6, a remaining portion of the via-hole 42 and the metal line trench 40 are filled with a conductive metal fill 74 (e.g., copper or copper alloy) to form a via 76 and a metal line 78, respectively, to define the metallization layer 19. The process continues by planarizing the IC 10 using a CMP process to remove any overburden conductive metal fill 74, the hard mask layer 23, and excess portions of the conductive metal seed layer 72, the liner 70, and the barrier layer 45 and to expose ILD layer 22, as illustrated in FIG. 7.

Figure 8:
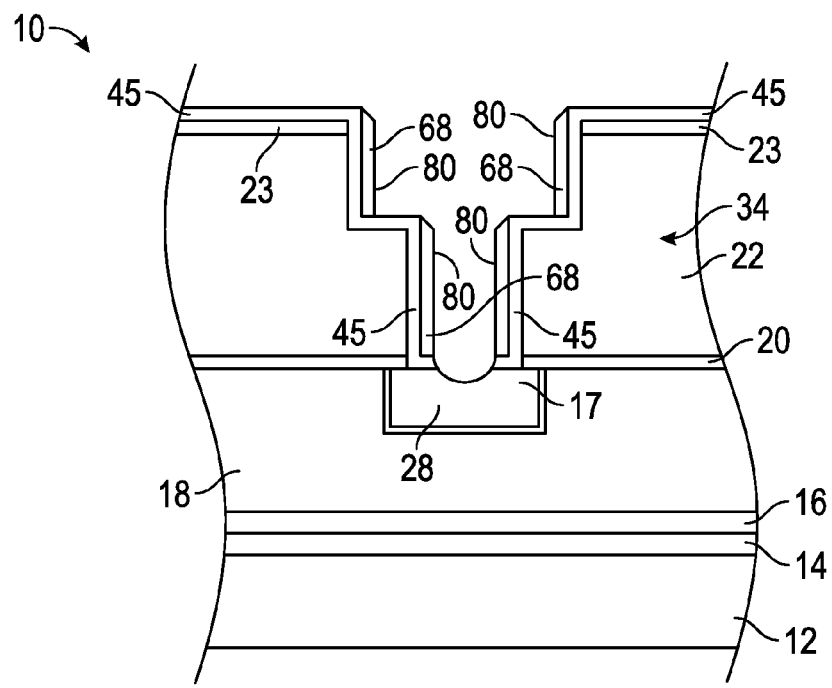

In an alternative embodiment, after depositing the liner-forming material 68 as illustrated in FIG. 4, for example to a thickness of about 10 to about 200 Å, portions of the liner-forming material 68 are etched back to form a partially etched liner layer 80 as illustrated in FIG. 8. In an exemplary embodiment, etching back the portions of the liner-forming material 68 removes a thickness of from about 10 to about 100 Å of liner-forming material 68 to form the partially etched liner layer 80. In an exemplary embodiment, a dry etching process (e.g., plasma etching process) is used to remove the portions of the liner-forming material 68 and form the partially etched liner layer 80.

Figure 9:
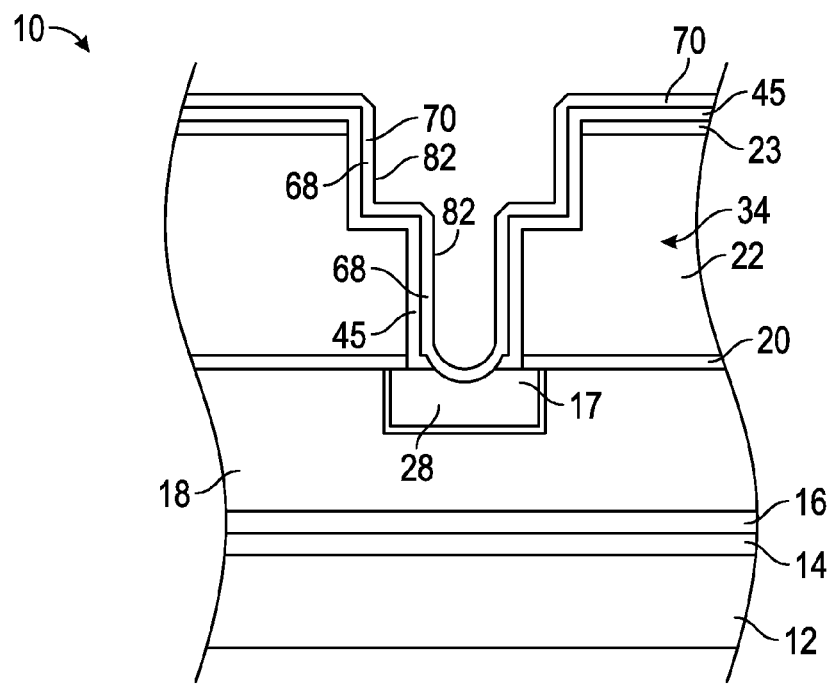

Referring to FIGS. 8-9, additional liner-forming material 82 (e.g., Ta via a PVD process or Ru and/or Co via a CVD process) is then deposited overlying the partially etched liner layer 80 to complete formation of the liner 70. In an exemplary embodiment, a thickness of from about 10 to about 200 Å of the additional liner-forming material 82 is deposited overlying the partially etched liner layer 80 to form the liner 70. In an exemplary embodiment and as illustrated, a portion of the barrier layer 45 directly above the metal line 28 is removed during the etch back process of the portions of the liner-forming material 68 so that the liner 70 can be formed penetrating (e.g., gouging or punching through) into the metal line 28 to help lower an overall resistance of the BEOL interconnect structure 34.

Figure 10:
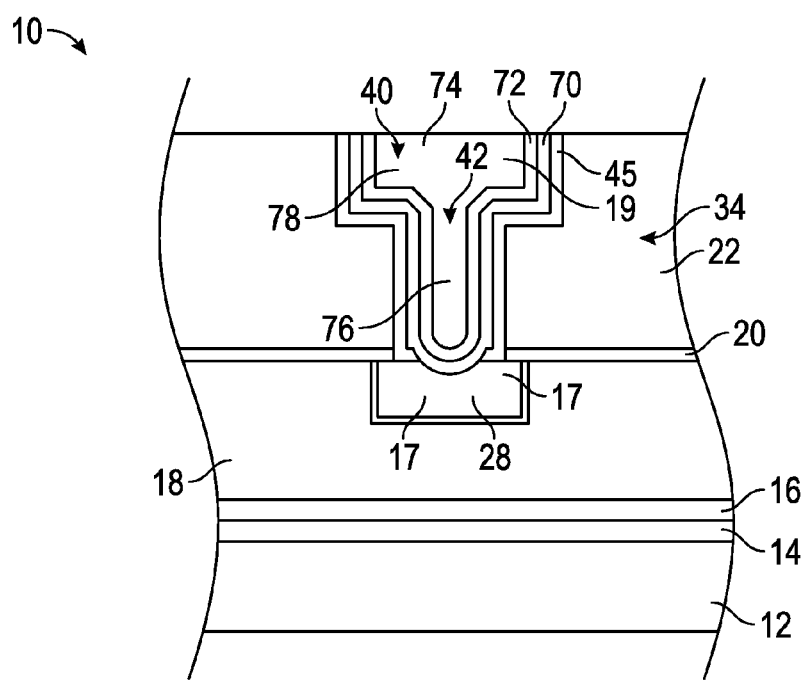

The process continues as illustrated in FIG. 10 by depositing the conductive metal seed layer 72 overlying the liner 70 and filling the remaining portion of the via-hole 42 and the metal line trench 40 with the conductive metal fill 74 to form the via 76 and the metal line 78 and to define the metallization layer 19 as described above in relation to FIGS. 5-6. The IC 10 is then planarized by a CMP process to remove any excess conductive metal fill 74, the hard mask layer 23, and excess portions of the conductive metal seed layer 72, the liner 70, and the barrier layer 45 and expose ILD layer 22. Accordingly, methods for fabricating integrated circuits including forming a robust barrier layer such as for a back-end-of-the-line interconnect structure have been described.

While at least one exemplary embodiment has been presented in the foregoing detailed description of the disclosure, it should be appreciated that a vast number of variations exist. It should also be appreciated that the exemplary embodiment or exemplary embodiments are only examples, and are not intended to limit the scope, applicability, or configuration of the disclosure in any way. Rather, the foregoing detailed description will provide those skilled in the art with a convenient road map for implementing an exemplary embodiment of the disclosure. It being understood that various changes may be made in the function and arrangement of elements described in an exemplary embodiment without departing from the scope of the disclosure as set forth in the appended claims.

What is claimed is:

1. A method for fabricating an integrated circuit, the method comprising:
   forming a barrier layer overlying a metal line of a metallization layer above a semiconductor substrate using an atomic layer deposition (ALD) process and a physical vapor deposition (PVD) process, wherein the barrier layer has a lower portion and a densified upper portion that has a greater density than the lower portion;
   depositing a liner-forming material overlying the barrier layer to form a liner; and
   depositing a conductive metal overlying the liner.

2. The method of claim 1, wherein forming the barrier layer comprises forming the barrier layer that comprises tantalum nitride (TaN).

3. The method of claim 1, wherein forming the barrier layer comprises:
   depositing a barrier-forming material using the ALD process to form a first layer that overlies the metal line; and
   depositing additional barrier-forming material using the PVD process to form a second layer that overlies the first layer.

4. The method of claim 3, wherein forming the barrier layer comprises forming the first layer having a thickness of from about 3 to about 30 Å.

5. The method of claim 3, wherein forming the barrier layer comprises forming the second layer having a thickness of from about 3 to about 100 Å.

6. The method of claim 3, wherein depositing the additional barrier-forming material comprises densifying an upper portion of the first layer via ion bombardment of the additional barrier-forming material onto the first layer.

7. The method of claim 6, wherein depositing the additional barrier-forming material comprises forming the barrier layer having the densified upper portion that has a thickness of from about 5 to about 103 Å.

8. The method of claim 1, wherein depositing the liner-forming material comprises depositing the liner-forming material that comprises tantalum (Ta).

9. The method of claim 1, wherein depositing the liner-forming material comprises depositing the liner-forming material by an additional PVD process.

10. The method of claim 1, wherein depositing the liner-forming material comprises depositing the liner-forming material that comprises ruthenium (Ru), cobalt (Co), or a combination thereof.

11. The method of claim 1, wherein depositing the liner-forming material comprises depositing the liner-forming material by chemical vapor deposition (CVD), ALD, or PVD.

12. A method for fabricating an integrated circuit, the method comprising:
   etching a via-hole through an ILD layer of dielectric material to expose a metal line of a metallization layer above a semiconductor substrate;
   depositing a first tantalum nitride (TaN) layer into the via-hole overlying the metal line using an atomic layer deposition (ALD) process;
   depositing a second TaN layer into the via-hole overlying the first TaN layer using a physical vapor deposition (PVD) process to form a barrier layer that comprises the first and second TaN layers;
   forming a liner in the via-hole overlying the barrier layer;
   depositing a conductive metal seed layer into the via-hole overlying the liner; and
   filling a remaining portion of the via-hole with a conductive metal fill overlying the conductive metal seed layer.

13. The method of claim 12, wherein forming the liner comprises forming the liner having a thickness of from about 20 to about 400 Å.

14. The method of claim 12, wherein forming the liner comprises:
   depositing a liner-forming material into the via-hole overlying the barrier layer to form a liner layer; and
   etching back portions of the liner layer to form a partially etched liner layer.

15. The method of claim 14, wherein depositing the liner-forming material comprises forming the liner layer having a thickness of from about 10 to about 200 Å.

16. The method of claim 14, wherein etching back the portions of the liner layer comprises removing a thickness of from about 10 to about 100 Å from the liner layer to form the partially etched liner layer.

17. The method of claim 14, further comprising:
   depositing additional liner-forming material overlying the partially etched liner layer to form the liner.

18. The method of claim 17, wherein depositing additional liner-forming material comprises depositing a thickness of from about 10 to about 200 Å of the additional liner-forming material overlying the partially etched liner layer.

19. A method for fabricating an integrated circuit, the method comprising:
   forming a barrier layer overlying a metal line of a metallization layer above a semiconductor substrate, wherein forming the barrier layer comprises:
      depositing a first tantalum nitride (TaN) layer overlying the metal line using an atomic layer deposition (ALD) process; and
      densifying an upper portion of the first TaN layer by depositing a second TaN layer overlying the first TaN layer using a physical vapor deposition (PVD) process, wherein the barrier layer comprises the first and second TaN layers and has a lower portion and a densified upper portion that comprises the second TaN layer and the upper portion of the first TaN layer and that has a greater density than the lower portion;
   forming a liner overlying the barrier layer; and
   depositing a conductive metal overlying the liner.

20. The method of claim 19, wherein densifying the upper portion of the first TaN layer comprises densifying the upper portion to a density of from about 13 to about 15 g/cm$^3$.

* * * * *